(12) United States Patent
Han et al.

(10) Patent No.: US 11,417,798 B2
(45) Date of Patent: Aug. 16, 2022

(54) LIGHT EMITTING DISPLAY APPARATUS

(71) Applicant: LG DISPLAY CO., LTD., Seoul (KR)

(72) Inventors: Kyunghoon Han, Seoul (KR); Wonhoe Koo, Goyang-si (KR); YongCheol Kim, Goyang-si (KR); Dongmin Sim, Gimpo-si (KR); YoungDock Cho, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/878,227

(22) Filed: May 19, 2020

(65) Prior Publication Data
US 2020/0373459 A1    Nov. 26, 2020

(30) Foreign Application Priority Data

May 23, 2019   (KR) .................. 10-2019-0060676

(51) Int. Cl.
| | | |
|---|---|---|
| *H01L 33/14* | (2010.01) | |
| *H01L 33/38* | (2010.01) | |
| *H01L 25/075* | (2006.01) | |
| *H01L 33/58* | (2010.01) | |
| *H01L 33/56* | (2010.01) | |

(52) U.S. Cl.
CPC .......... *H01L 33/14* (2013.01); *H01L 25/0753* (2013.01); *H01L 33/385* (2013.01); *H01L 33/56* (2013.01); *H01L 33/58* (2013.01)

(58) Field of Classification Search
CPC ....... H01L 33/14; H01L 33/385; H01L 33/58; H01L 33/56
See application file for complete search history.

(56) References Cited

U.S. PATENT DOCUMENTS

| | | | | |
|---|---|---|---|---|
| 2013/0015360 | A1* | 1/2013 | Kobayashi | .............. G01T 1/202 250/366 |
| 2014/0361253 | A1* | 12/2014 | Choi | ...................... H01L 51/56 257/40 |
| 2016/0093828 | A1* | 3/2016 | Kim | ..................... H01L 51/5203 257/40 |
| 2017/0092705 | A1* | 3/2017 | Lim | ....................... H01L 27/326 |
| 2017/0294493 | A1* | 10/2017 | Yoo | ..................... H01L 27/3218 |
| 2018/0006258 | A1* | 1/2018 | Kim | ..................... G02B 17/026 |

FOREIGN PATENT DOCUMENTS

| | | |
|---|---|---|
| KR | 10-2013-0085195 A | 7/2013 |
| KR | 10-2017-0123569 A | 11/2017 |

* cited by examiner

*Primary Examiner* — Jay C Chang
*Assistant Examiner* — Mikka Liu
(74) *Attorney, Agent, or Firm* — Birch, Stewart, Kolasch & Birch, LLP

(57) ABSTRACT

A light emitting display apparatus can include an insulating layer on a substrate and the insulating layer includes a base portion and a protrusion portion. The light emitting display apparatus further includes a first electrode covering an upper portion of the base portion and a side portion and an upper portion of the protrusion portion. The light emitting display apparatus further includes a bank layer covering a portion of the insulating layer and a portion of the first electrode and having a concave portion. The light emitting display apparatus further includes a light emitting layer on the first electrode and the bank layer, and a second electrode on the light emitting layer.

18 Claims, 6 Drawing Sheets

LIGHT EMITTING DISPLAY APPARATUS

CROSS-REFERENCE TO RELATED APPLICATIONS

This application claims the benefit of and priority to Korean Patent Application No. 10-2019-0060676, filed on May 23, 2019 in the Republic of Korea, the entirety of which is hereby incorporated by reference into the present application.

BACKGROUND

Technical Field

The present disclosure relates to a light emitting display apparatus, and more particularly, to a light emitting display apparatus having improved light extraction efficiency and improved front light extraction efficiency.

Discussing of the Related Art

Recently, as our society advances toward an information-oriented society, the field of display apparatuses for visually expressing electrical information signals has rapidly advanced. Various display apparatuses, having excellent performance in terms of thinness, lightness, and low power consumption, are being developed correspondingly.

Among these various display apparatuses, a light emitting display apparatus is a self-light emitting display apparatus, and can be manufactured to have lightness and thinness since it does not require a separate light source, unlike a liquid crystal display. In addition, the light emitting display apparatus has advantages in terms of power consumption due to a low voltage driving, and is excellent in terms of a color implementation, a response speed, a viewing angle, and a contrast ratio (CR) Therefore, light emitting display apparatuses are expected to be utilized in various fields.

SUMMARY

Light emitted from a light emitting layer of a light emitting display apparatus can output to the outside of the light emitting display apparatus through various components of the light emitting display apparatus. However, in the light emitted from the light emitting layer, there exists light trapped inside the light emitting display apparatus without extracting to the outside of the light emitting display, whereby the light extraction efficiency of the light emitting display apparatus can be a problem.

For example, there is a problem in which some of the light emitted from the light emitting layer in the light emitting display apparatus is trapped inside the light emitting display apparatus due to losses in total reflection, optical waveguide, and surface plasmon. Here, the loss in total reflection refers to a degradation in light extraction efficiency due to the light trapped inside the light emitting display apparatus, of the light emitted from the light emitting layer, by total reflection at an interface between a substrate and the air. The loss in optical waveguide refers to a degradation in light extraction efficiency due to the light trapped inside by total reflection at an interface of components inside the light emitting display apparatus. The loss in surface plasmon refers to a situation when light vibrates free electrons of a metal surface due to a phenomenon in which the light is absorbed onto the metal surface during light incidence and propagation, whereby the reflection or transmission of the light is prevented to thereby result in a degradation in light extracting efficiency.

As such, the inventors of the present disclosure have invented an improved light emitting display apparatus having a new structure to improve light extraction efficiency of the light emitting display apparatus by improving losses in total extraction and optical waveguide. For example, the inventors of the present disclosure form an insulating layer to have a base portion having a planar upper surface and a protrusion portion projecting from the base portion, and dispose an anode having a reflective layer on a side portion of the base portion and the protrusion portion. Accordingly, the reflective layer of the anode formed on the side portion of the protrusion portion can function as a side mirror, and some of the light trapped inside the light emitting display apparatus by total reflection is extracted in a front direction of the light emitting display apparatus, whereby light extraction efficiency of the light emitting display apparatus is improved.

However, the inventors of the present disclosure have recognized a limitation in which even when using the aforementioned light emitting display apparatus, light loss due to a loss in optical waveguide still exists and the front light extraction efficiency is lowered.

For example, some of the light emitted from the light emitting layer can be totally reflected and trapped in an area formed by a light emitting layer disposed between a bank layer and an organic encapsulating layer, a cathode, and an inorganic encapsulating layer. A material forming the bank layer has a refractive index of about 1.6, an organic material forming the light emitting layer has a refractive index of about 1.8 to 1.9, an inorganic material forming a first encapsulating layer has a refractive index of about 1.8, and an organic material forming the organic encapsulating layer has a refractive index of about 1.5 to about 1.6. In addition, a metal material forming the cathode has a refractive index of about 0.13, but in a top emission type light emitting display apparatus, since the cathode is formed to have a very small thickness, it is substantially transparent. Therefore, the refractive index of the cathode may not significantly affect total reflection. Thus, the cathode can be ignored, and since the light emitting layer and the inorganic encapsulating layer have similar refractive indices, total reflection can be made at an interface of the light emitting layer and the bank layer and at an interface of the inorganic encapsulating layer and the organic encapsulating layer.

In addition, in the light trapped due to total reflection occurring at the interface between the light emitting layer and the bank layer and an interface between the inorganic encapsulating layer and a foreign material covering layer, there exists light emitted outwardly from a region where the bank layer is planarized. However, since this light travels at a large incidence angle, it is totally reflected back to the inside of the light emitting display apparatus at an interface between the light emitting display apparatus and the air and is trapped inside the light emitting display apparatus, or even if extracted outside, it is extracted in a lateral direction, rather than a front direction, whereby the degree of improving front light extraction efficiency can be significantly low.

In addition, when a bank layer is formed of an organic material, the bank layer is formed to have a convex shape and a large thickness on the side portion of the protrusion portion. This increases a space between a convex side surface of the bank layer and the reflective layer of the anode. Since light has properties in which it spreads as moving from a narrow space to a wide space, the light emitted from the light emitting layer spreads in the bank layer, which is a wide space, so that the amount of light reaching a side mirror structure is reduced, thereby resulting in a reduction in light extraction efficiency of the light emitting display apparatus.

Accordingly, the inventors of the present disclosure have further invented an improved light emitting display apparatus having a new structure, capable of improving the light extraction efficiency of light lost by a loss in an optical waveguide as well as a loss in total reflection, and capable of improving the front light extraction efficiency.

Therefore, an aspect of the present disclosure is to provide a light emitting display apparatus in which a bank layer is concave to improve light extraction efficiency.

Another aspect of the present disclosure is to provide a light emitting display apparatus capable of improving light extraction efficiency by disposing an anode having a side mirror shape in a concave manner.

Another aspect of the present disclosure is to provide a light emitting display apparatus capable of improving light extraction efficiency and front light extraction efficiency, thereby improving power consumption.

Additional features and aspects will be set forth in the description that follows, and in part will be apparent from the description, or can be learned by practice of the inventive concepts provided herein. Other features and aspects of the inventive concepts can be realized and attained by the structure particularly pointed out in the written description, or derivable therefrom, and the claims hereof as well as the appended drawings.

According to an embodiment of the present disclosure, a light emitting display apparatus includes an insulating layer on a substrate and having a base portion and a protrusion portion, a first electrode covering an upper portion of the base portion and a side portion and an upper portion of the protrusion portion, a bank layer covering a portion of the insulating layer and a portion of the first electrode and having a concave portion, a light emitting layer on the first electrode and the bank layer, and a second electrode on the light emitting layer.

According to another embodiment of the present disclosure, a light emitting display apparatus includes an overcoating layer on a substrate and having a base portion and a protrusion portion, a light emitting element on the overcoating layer and including a first electrode, a light emitting layer, and a second electrode, a bank layer between the first electrode and the light emitting layer and configured to define a light emitting area, and an encapsulating part on the light emitting element, wherein a side surface of the bank layer includes a light extraction pattern configured to improve a light extraction efficiency and a front light extraction efficiency by minimizing spreading of light emitted from the light emitting layer.

Other devices, systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure. It is to be understood that both the foregoing general description and the following detailed description of the present disclosure are examples and explanatory, and are intended to provide further explanation of the disclosure as claimed.

According to an embodiment of the present disclosure, the light extraction efficiency of the light emitting display apparatus can be improved by using an anode having a side mirror shape.

According to an embodiment of the present disclosure, the light extraction efficiency can increase by reducing light lost by a loss in optical waveguide, of the light emitted from the light emitting layer.

According to an embodiment of the present disclosure, the light extraction efficiency can increase by changing a path of the light emitted from the light emitting layer According to an embodiment of the present disclosure, a light emitting display apparatus having improved power consumption by improving the light extraction efficiency and the front light extraction efficiency can be implemented.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, that can be included to provide a further understanding of the disclosure and are incorporated in and constitute a part of this specification, illustrate embodiments of the disclosure and together with the description serve to explain various principles of the disclosure.

DETAILED DESCRIPTION OF THE EMBODIMENTS

Figure 1:
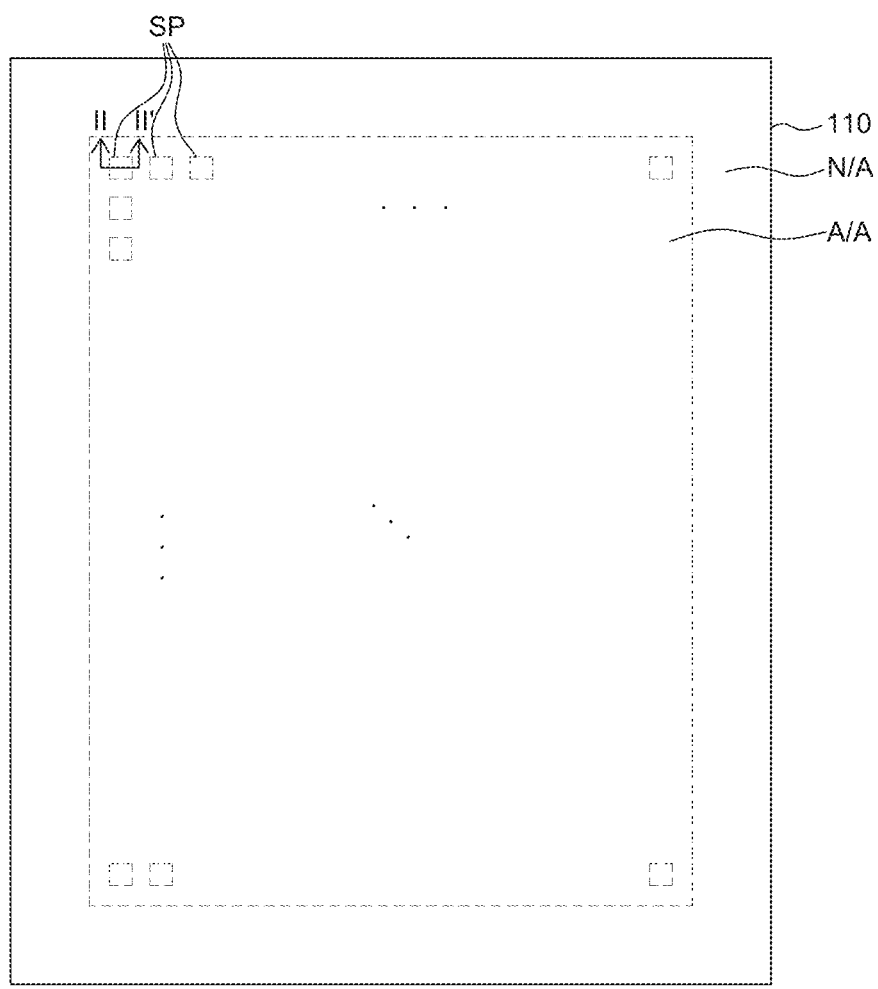
FIG. 1 is a plan view of a light emitting display apparatus according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as "include," "comprise," and "have," used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

When an element or layer is disposed "on" another element or layer, another layer or another element can be interposed directly on the other element or therebetween.

Although the terms "first", "second", and the like are used for describing various components, these components are not confined by these terms and do not necessarily define any order. These terms are merely used for distinguishing one component from the other components. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a light emitting display apparatus according to exemplary embodiments of the present disclosure will be described in detail with reference to accompanying drawings. All the components of the light emitting display apparatus according to all embodiments of the present disclosure are operatively coupled and configured.

Figure 2:
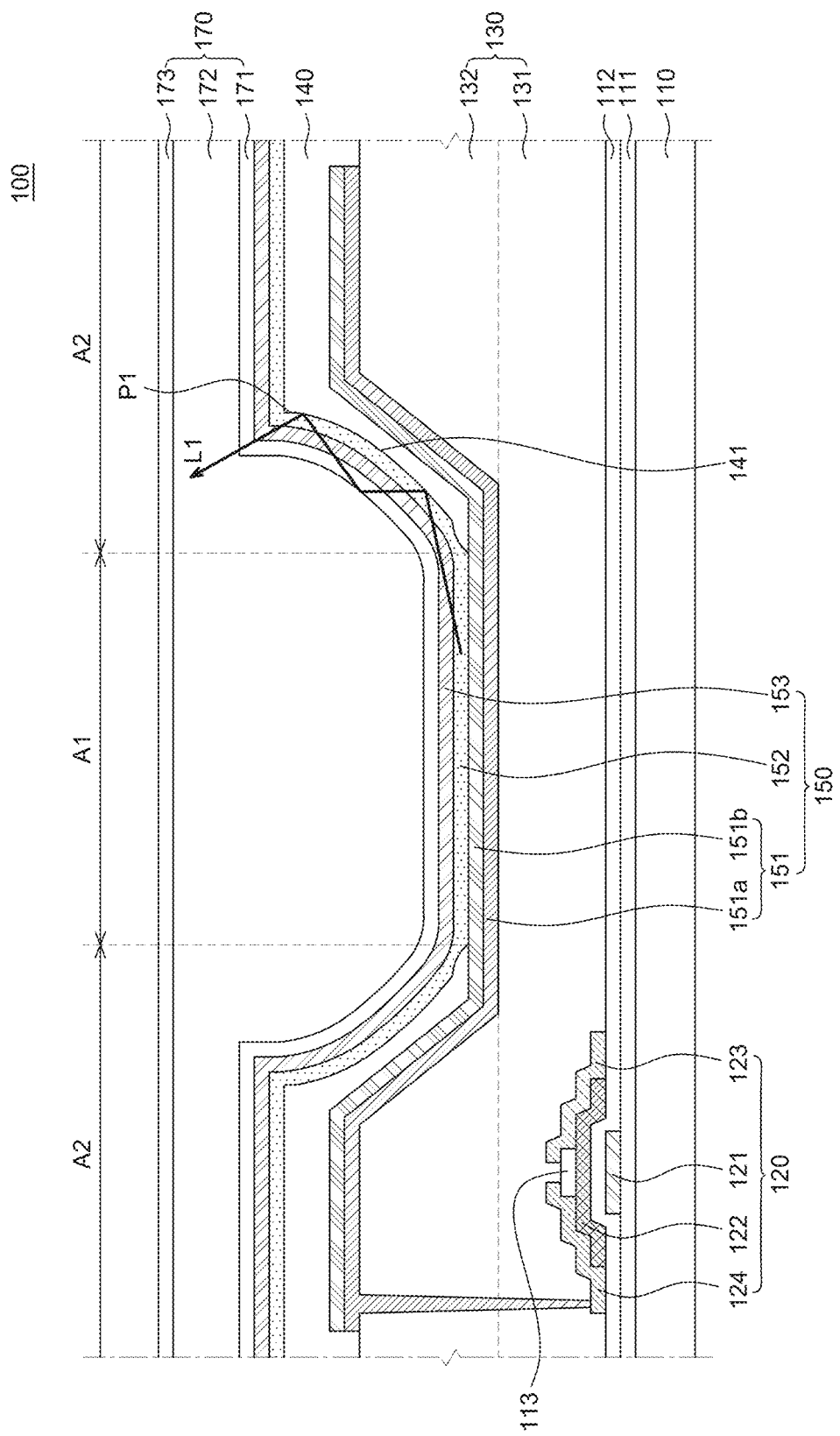
FIG. 2 is a cross-sectional view of the light emitting display apparatus, taken along line II-II' of FIG. 1.

FIG. 1 is a plan view of a light emitting display apparatus according to an exemplary embodiment of the present disclosure. FIG. 2 is a cross-sectional view of the light emitting display apparatus, taken along line II-II' of FIG. 1.

With reference to FIGS. 1 and 2, a light emitting display apparatus 100 includes a substrate 110, a thin film transistor 120, a light emitting element 150 and an encapsulating part 170. The light emitting display apparatus 100 can be implemented as a top-emission type light emitting display apparatus.

With reference to FIGS. 1 and 2, the substrate 110 can support and protect various components of the light emitting display apparatus 100. The substrate 110 can be formed of glass or a plastic material having flexibility. When the substrate 110 is formed of a plastic material, for example, it can be formed of polyimide (PI). However, embodiments of the present disclosure are not limited thereto.

The substrate 110 includes a display area A/A and a non-display area N/A.

The display area A/A is an area where images are displayed in the light emitting display apparatus 100. In the display area A/A, a display element and a variety of driving elements for driving the display element can be disposed. For example, the display element can be configured of a light emitting element 150 including a first electrode 151, a light emitting layer 152 and a second electrode 153. In addition, various elements such as the thin film transistor 120 for driving the display element, a capacitor or wirings can be disposed in the display area A/A.

The display area A/A can include a plurality of sub pixels SP. The sub pixel SP is a minimum unit for configuring a screen, and each of the plurality of sub pixels SP can include the light emitting element 150 and a driving circuit. Each of the plurality of sub pixels SP can emit different wavelengths of light. For example, the plurality of sub pixels SP can include a red sub pixel, a green sub pixel and a blue sub pixel. However, the plurality of sub pixels SP are not limited to, and can further include a white sub pixel.

The driving circuit of the sub pixels SP is a circuit for controlling a driving of the light emitting element 150. For example, the driving circuit can be configured to include the thin film transistor 120 and a capacitor, but is not limited thereto.

The non-display area N/A is an area where no image is displayed and various components for driving the plurality of sub pixels SP disposed in the display area A/A can be disposed. For example, a driver IC which supplies a signal for driving the plurality of sub pixels SP, a flexible film or the like can be disposed in the non-display area N/A.

The non-display area N/A can be an area surrounding the display area A/A as illustrated in FIG. 1, but is not limited thereto. For example, the non-display area N/A can be an area extending from the display area A/A.

With reference to FIG. 2, a buffer layer 111 is disposed on the substrate 110. The buffer layer 111 can improve adhesion between layers formed on the buffer layer 111 and the substrate 110 and can block an alkali component or the like, flowing out of the substrate 110. The buffer layer 111 can be formed as a single layer of silicon nitride (SiNx) or silicon oxide (SiOx) or a multiple layer of silicon nitride (SiNx) or silicon oxide (SiOx), but is not limited thereto. The buffer layer 111 is not an essential component and can be omitted based on a type and material of the substrate 110 and a structure and type of the thin film transistor 120.

The thin film transistor 120 is disposed on the substrate 110. The thin film transistor 120 can be a driving element of the light emitting display apparatus 100. The thin film transistor 120 includes a gate electrode 121, an active layer 122, a source electrode 123, and a drain electrode 124. In the light emitting display apparatus 100 according to an exemplary embodiment of the present disclosure, the thin film transistor 120 has a structure in which the active layer 122 is disposed on the gate electrode 121, and the source electrode 123 and the drain electrode 124 are disposed on the active layer 122. Therefore, the thin film transistor 120 has a bottom gate structure in which the gate electrode 121 is disposed in the lowermost portion, but is not limited thereto.

The gate electrode 121 of the thin film transistor 120 is disposed on the substrate 110. The gate electrode 121 can be any one of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a multiple layer thereof, but, embodiments are not limited thereto.

A gate insulating layer 112 is disposed on the gate electrode 121. The gate insulating layer 112 is a layer for electrically insulating the gate electrode 121 from the active layer 122 and can be formed of an insulating material. For example, the gate insulating layer 112 can be formed as a single layer of silicon nitride (SiNx) or silicon oxide (SiOx) which is an inorganic material or a multiple layer of silicon nitride (SiNx) or silicon oxide (SiOx), but embodiments are not limited thereto.

The active layer 122 is disposed on the gate insulating layer 112. The active layer 122 is disposed so as to overlap the gate electrode 121. For example, the active layer can be formed of an oxide semiconductor or amorphous silicon (a-Si), polycrystalline silicon (poly-Si), or an organic semiconductor.

An etch stopper 113 is disposed on the active layer 122. The etch stopper 113 prevents damage to the surface of the active layer 122 due to plasma when the source electrode 123 and the drain electrode 124 are patterned by an etching method. One portion of the etch stopper 113 overlaps the source electrode 123 and the other portion of the etch stopper 113 overlaps the drain electrode 124. However, the etch stopper 113 can be omitted.

The source electrode 123 and the drain electrode 124 are disposed on the active layer 122 and the etch stopper 113. The source electrode 123 and the drain electrode 124 are disposed on the same layer and are spaced apart from each other. The source electrode 123 and the drain electrode 124 can be electrically connected to the active layer 122 to be in contact with the active layer 122. The source electrode 123 and the drain electrode 124 can be formed of any one or more of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a multiple layer thereof, but, embodiments are not limited thereto.

An overcoating layer 130 is disposed on the thin film transistor 120. The overcoating layer 130 can protect the thin film transistor 120 and smooth steps of the layers on the substrate 110. The overcoating layer 130 can be formed of one of acrylic resin, epoxy resin, phenol resin, polyamide resin, polyimide resin, unsaturated polyester resin, polyphenylene resin, polyphenylene sulfide resin, benzocyclobutene, and photoresist, but embodiments are not limited thereto.

The overcoating layer 130, which can be referred to as an insulating layer, includes a base portion 131 and a protrusion portion 132. The base portion 131 and the protrusion portion 132 can be integrally formed as shown in FIG. 2. For example, the base portion 131 and the protrusion portion 132 can be formed of the same material and can be formed simultaneously through the same process, for example, a mask process, but is not limited thereto.

The base portion 131 is disposed on the thin film transistor 120. An upper surface of the base portion 131 has a surface parallel to the substrate 110. Accordingly, the base portion 131 can protect the thin film transistor 120 and planarize a step difference between the layers on the substrate 110.

The protrusion portion 132 is disposed on the base portion 131. The protrusion portion 132 is integrally formed with the base portion 131 and is formed to protrude from the base portion 131. Thus, an upper surface of the protrusion portion 132 can be smaller than a lower surface thereof. However, the protrusion portion 132 is not limited thereto.

The protrusion portion 132 includes the upper surface and a side surface. The upper surface of the protrusion portion 132 can be a surface at the uppermost of the protrusion portion 132 and can be a surface substantially parallel to the base portion 131 or the substrate 110. The side surface of the protrusion portion 132 can be a surface connecting the upper surface of the protrusion portion 132 and the base portion 131. The side surface of the protrusion portion 132 can have a shape inclined toward the base portion 131 from the upper surface thereof.

FIG. 2 illustrates the overcoating layer 130 which includes the base portion 131 having a planar upper surface and the protrusion portion 132 protruding from the base portion 131. However, as long as the overcoating layer 130 has a shape in which the base portion 131 and the protrusion portion 132 are embodied, a detailed configuration of the overcoating layer 130 is not limited to the base portion 131 and the protrusion portion 132, and can be variously defined.

The light emitting element 150 is disposed on the overcoating layer 130. The light emitting element 150 includes a first electrode 151 on the overcoating layer 130, a light emitting layer 152 on the first electrode 151, and a second electrode 153 on the light emitting layer 152.

The first electrode 151 is disposed on the overcoating layer 130 to cover side and upper portions of the base portion 131 and the protrusion portion 132. For example, the first electrode 151 can be disposed on the upper surface of the base portion 131 on which the protrusion portion 132 is not disposed, the side surface of the protrusion portion 132, and a portion of the upper surface of the protrusion portion 132, and can be disposed along shapes of the base portion 131 and the protrusion portion 132.

The first electrode 151 includes a reflective layer 151a electrically connected to the thin film transistor 120 and a transparent conductive layer 151b on the reflective layer 151a.

The reflective layer 151a of the first electrode 151 is disposed on the overcoating layer 130. Since the light emitting display apparatus 100 according to an exemplary embodiment of the present disclosure is a top emission type light emitting display apparatus, the reflective layer 151a can reflect light emitted from the light emitting element 150 upwards. Light generated from the light emitting layer 152 of the light emitting element 150 may not be emitted only upwards, but can also be emitted laterally. The light emitted laterally can be directed to the inside of the light emitting display apparatus 100, can be trapped inside the light emitting display apparatus 100 by total reflection, and can travel and be extinguished in an inward direction of the light emitting display apparatus 100. Accordingly, the reflective layer 151a is disposed under the light emitting layer 152 and is disposed to cover the side portion of the protrusion portion 132, whereby a traveling direction of the light traveling toward a side portion of the light emitting layer 152 can be changed to a front direction.

The reflective layer 151a can be formed of a metal material, and for example, can be formed of a metal material such as aluminum (Al), silver (Ag), copper (Cu), or magnesium-silver alloy (Mg:Ag), but, embodiments are not limited thereto. The reflective layer 151a can be electrically connected to the drain electrode 124 through a contact hole formed in the overcoating layer 130. As another example, the reflective layer 151a is layer can be electrically connected to the source electrode 123 through the contact hole formed in the overcoating layer 130.

The transparent conductive layer 151b is disposed on the reflective layer 151a. The transparent conductive layer 151b is disposed on the reflective layer 151a and is electrically connected to the drain electrode 124 through the reflective layer 151a. The transparent conductive layer 151b can be formed of a conductive material having a high work function to supply holes to the light emitting layer 152. For example, the transparent conductive layer 151b can be formed of a transparent conductive oxide such as indium tin oxide (ITO), indium zinc oxide (IZO), indium tin zinc oxide (ITZO), zinc oxide (ZnO), and tin oxide (TO), but embodiments are not limited thereto.

A bank layer 140 is disposed on the first electrode 151 and the overcoating layer 130. The bank layer 140 can cover a portion of the first electrode 151 of the light emitting element 150 and define a first area A1 that is a light emitting area and a second area A2 that is a non-light emitting area. For example, in the second area A2, the bank layer 140 can be disposed between the first electrode 151 and the light emitting layer 152 to block generation of light in the second area A2. Since the bank layer 140 is not disposed in the first area A1, the light emitting layer 152 can be directly positioned on the first electrode 151 to generate light from the light emitting layer 152.

The bank layer 140 can be formed of an organic material. For example, the bank layer 140 can be formed of polyimide, acrylic, or a benzocyclobutene-based resin, but embodiments are not limited thereto. When the bank layer 140 is formed of an organic material, a refractive index of the bank layer 140 can be about 1.6.

The bank layer 140 includes a concave portion 141. The bank layer 140 can include a single concave portion. The concave portion 141 of the bank layer 140 can be disposed at a position corresponding to the side portion of the protrusion portion 132. For example, the concave portion 141 of the bank layer 140 can be formed to have a concave groove shape, and can be singularly disposed in a position corresponding to the side portion of the protrusion portion 132. When the concave portion 141 of the bank layer 140 is singularly formed, a light path of the light emitted from the light emitting layer 152 can be changed by the concave portion 141 of the bank layer 140. And, the light, the light path of which has been changed can travel toward the front of the light emitting display apparatus 100 without being affected by other structures. Therefore, since the concave portion 141 of the bank layer 140 can improve light extraction efficiency and front light extraction efficiency of light emitted from the light emitting layer 152, it can be referred to as a light extraction pattern.

A slope of a tangent (or tangent line) at a position on the concave portion 141 of the bank layer 140 can increase as the position is or moves away from the substrate 110. For example, the slope of the tangent of the concave portion 141 of the bank layer 140 is lowest at a point or surface of the concave portion nearest to the substrate 110 and increases as the position is or moves away from the substrate 110. The slope of the tangent of the concave portion 141 of the bank layer 140 can be largest at a point or surface of the concave portion farthest from the substrate 110. A side portion of the bank layer 140 can include a surface P1 connected to an upper portion of the concave portion 141 and perpendicular to the substrate 110.

The concave portion 141 of the bank layer 140 can be disposed to surround the first area A1 on a plane. For example, the concave portion 141 of the bank layer 140 is disposed in the second area A2 so as to be adjacent to the first area A1 and has a shape of a closed loop surrounding the first area A1. In one example, the concave portion 141 may not extend into the first area A1.

The bank layer 140 can be formed of an organic material. For example, the bank layer 140 can be formed of polyimide, acrylic, or benzocyclobutene-based resin, but embodiments are not limited thereto.

The concave portion 141 of the bank layer 140 can be formed by a dry etching process. When the bank layer 140 is formed by an exposure process, the side portion of the bank layer 140 can be formed in a convex shape. Accordingly, in the light emitting display apparatus 100 according to an exemplary embodiment of the present disclosure, the bank layer 140 can be formed to have the concave portion 141 by a dry etching process when the bank layer 140 is formed.

The light emitting layer 152 is disposed on the first electrode 151 and the bank layer 140. For example, the light emitting layer 152 is disposed on the first electrode 151 in the first area A1 which is the light emitting area, and is disposed on the bank layer 140 in the second area A2 which is the non-light emitting area.

The light emitting layer 152 is a layer for emitting light having a specific color and includes at least one or more of a red light emitting layer, a green light emitting layer, a blue light emitting layer, and a white light emitting layer. Further, the light emitting layer 152 can further include various layers such as a hole transporting layer, a hole injecting layer, a hole blocking layer, an electron injecting layer, an electron blocking layer or an electron transporting layer. A refractive index of the light emitting layer 152 can be different based on a kind of organic material forming the light emitting layer 152, but an organic material that can be used for the light emitting layer 152 can have a refractive index of about 1.8 to about 1.9 on average. The light emitting layer 152 can be an organic light emitting layer formed of an organic material, but embodiments are not limited thereto. For example, the light emitting layer 152 can be a quantum dot light emitting layer or a micro-LED.

As the light emitting layer 152 is disposed on the first electrode 151 and the bank layer 140 in the second area A2, the light emitting layer 152 can also be disposed along the shape of the bank layer 140. Thus, the light emitting layer 152 can have a planar upper surface on the upper surface of the protrusion portion 132 and the upper surface of the base portion 131, and can have a concave upper surface on the side portion of the protrusion portion 132.

The second electrode 153 is disposed on the light emitting layer 152. The second electrode 153 supplies electrons to the light emitting layer 152. The second electrode 153 can be formed of a transparent conductive oxide such as indium tin oxide (ITO), indium zinc oxide (IZO), indium tin zinc oxide (ITZO), zinc oxide (ZnO), and tin oxide (TO) or ytterbium (Yb) alloy. When the second electrode 153 is formed of a transparent conductive oxide such as indium tin oxide (ITO), a reflective index of the second electrode can be about 1.8 to 19. In addition, the second electrode 153 can be formed of a metal material such as silver (Ag), copper (Cu), or an alloy of magnesium and silver (Mg:Ag) or a very thin metal material. However, the present disclosure is not limited thereto. When the second electrode 153 is formed of the metal material, the second electrode 153 can have a significantly low refractive index. For example, when silver (Ag) is used as the second electrode 153, the refractive index of the second electrode 153 can be about 0.13. As the light emitting display apparatus 100 is a top emission type light emitting display apparatus, the second electrode 153 has a very thin thickness and thus, the refractive index of the second electrode 153 may not affect the traveling of light.

As the second electrode 153 is disposed on the light emitting layer 152 in the second area A2, the second electrode 153 can also be disposed along the shape of the bank layer 140. Thus, the second electrode 153 can have a planar upper surface on the upper surface of the protrusion portion 132 and the upper surface of the base portion 131, and can have a concave upper surface on the side portion of the protrusion portion 132.

An encapsulating part 170 is disposed on the light emitting element 150. The encapsulating part 170 can be disposed to cover the second electrode 153. The encapsulating part 170 can protect the light emitting layer 150 from moisture, oxygen, or the like penetrating from the outside of the light emitting display apparatus 100.

The encapsulating part 170 includes a first encapsulating layer 171, a second encapsulating layer 172, and a third encapsulating layer 173.

The first encapsulating layer 171 is disposed on the second electrode 153 and functions to suppress the penetration of moisture or oxygen. The first encapsulating layer 171 can be formed of an inorganic material such as silicon nitride (SiNx), silicon oxynitride (SiNxOy), aluminum oxide (AlyOz) or the like, but is not limited thereto. In this case, the first encapsulating layer 171 can be formed of a material having a refractive index greater than that of the second encapsulating layer 172. For example, when the first encapsulating layer 171 is formed of silicon nitride (SiNx) or silicon oxynitride (SiNxOy), a refractive index of the first encapsulating layer 171 can be about 1.8.

As the first encapsulating layer 171 is disposed on the second electrode 153, the first encapsulating layer 171 can also be disposed along a shape of the second electrode 153. Accordingly, the first encapsulating layer 171 can have a planar upper surface on the upper surface of the protrusion portion 132 and the upper surface of the base portion 131, and can have a concave upper surface on the side portion of the protrusion portion 132.

The second encapsulating layer 172 is disposed on the first encapsulating layer 171 to planarize a surface thereof. In addition, the second encapsulating layer 172 can cover foreign matter or particles that can occur in a manufacturing process. The second encapsulating layer 172 can be formed of an organic material, for example, silicon oxycarbon (SiOxCz), acrylic, epoxy resin or the like, but is not limited thereto. The second encapsulating layer 172 can be formed of a material having a refractive index less than that of the first encapsulating layer 171. For example, when the second encapsulating layer 172 is an acrylic-based resin, the refractive index of the second encapsulating layer 172 can be about 1.5 to about 1.6.

The third encapsulating layer 173 is disposed on the second encapsulating layer 172, and similar to the first encapsulating layer 171, it can suppress the penetration of moisture or oxygen. The third encapsulating layer 173 can be formed of an inorganic material such as silicon nitride (SiNx), silicon oxynitride (SiNxOy), silicon oxide (SiOx), aluminum oxide (AlyOz) or the like, but embodiments are not limited thereto. The third encapsulating layer 173 can be formed of the same material as or a different material from the first encapsulating layer 171.

Since the light emitting display apparatus 100 according to an exemplary embodiment of the present disclosure is a top emission type light emitting display apparatus, it can be manufactured such that microcavity is implemented. For example, in the light emitting display apparatus 100 according to an exemplary embodiment of the present disclosure, constructive interference of light emitted from the light emitting layer 152 can be implemented by adjusting a distance between the reflective layer 151a of the first electrode 151 and the second electrode 153, thereby enhancing light efficiency.

In related art light emitting display apparatuses, light trapped and lost inside the light emitting display apparatus, of the light emitted from the light emitting layer, has become a factor in lowering light emission efficiency. For example, in the light emitted from the light emitting layer, there occurs light that may not be extracted to the outside of the light emitting display apparatus due to a loss in total reflection or a loss in optical waveguide, so that light extraction efficiency of the light emitting display apparatus is degraded. For example, in related art light emitting display apparatuses, since a first electrode formed on an overcoating layer having a planar upper surface is used, light output or emitted at a low emission angle, of the light emitted from the light emitting layer, can be trapped in the light emitting display apparatuses.

Accordingly, the light emitting display apparatus 100 according to an exemplary embodiment of the present disclosure can improve light extraction efficiency of the light emitting element 150 by the overcoating layer 130 having the protrusion portion 132. For example, in the light emitting display apparatus 100 according to an exemplary embodiment of the present disclosure, the overcoating layer 130 is configured to include the base portion 131 and the protrusion portion 132 protruding from the base portion 131, and the reflective layer 151a of the first electrode 151 of the light emitting element 150 is disposed to cover the base portion 131 and at least the side surface of the protrusion portion 132. Therefore, light output or emitted at a low emission angle, of the light emitted from the light emitting layer 152 of the light emitting display apparatus 100, can be extracted in a front direction by the reflective layer 151a of the first electrode 151 disposed on the side portion of the protrusion portion 132. For example, when a first electrode is disposed on an overcoating layer having a planar shape as in related art light emitting display apparatuses, laterally directed light, for example, light output or emitted at a low emission angle does not travel in the front direction and may not be extracted to the outside of the light emitting display apparatus due to a loss in total reflection or a loss in optical waveguide. However, in the light emitting display apparatus 100 according to an exemplary embodiment of the present disclosure, the light output or emitted from the light emitting layer 152 at a low emission angle is reflected on the reflective layer 151a of the first electrode 151 on the side portion of the protrusion portion 132, and can be extracted in the front direction. Accordingly, in the light emitting display apparatus 100 according to an exemplary embodiment of the present disclosure, the reflective layer 151a of the first electrode 151 on the side portion of the overcoating layer 130 functions as a side mirror, such that light which can be lost within the light emitting display apparatus 100 can be extracted in the front direction, thereby enhancing light extraction efficiency and power consumption.

In addition, when forming a bank layer formed of an organic material, the bank layer is formed to have a convex shape on the side portion of the protrusion portion and is disposed to have a large thickness. Accordingly, a space between a convex side surface of the bank layer and the reflective layer of the first electrode increases. Since light has properties in which it spreads as moving from a narrow space to a wide space, the light emitted from the light emitting layer spreads in the bank layer which is a wide space, and thus, the amount of light reaching a side mirror structure is reduced, thereby resulting in a decrease in light extraction efficiency of the light emitting display apparatus.

However, in the light emitting display apparatus 100 according to an exemplary embodiment of the present disclosure, the concave portion 141 is disposed in the bank layer 140 on the side portion of the protrusion portion 132 of the overcoating layer 130, so that a light spreading phenomenon in the bank layer 140 can be minimized. Therefore, by the concave portion 141 of the bank layer 140, a gap between the light emitting layer 152 and the first electrode 151 is minimized and the amount of light reaching the first electrode 151 of the side mirror structure increases, whereby light extraction efficiency of the light emitting display apparatus 100 can increase. For example, in a case where the concave portion 141 is disposed in the bank layer 140 on the side portion of the protrusion portion 132, a space between the side surface of the bank layer 140 and the side surface of the protrusion portion 132 is reduced, as compared to a case where the side surface of the bank layer 140 has a convex shape. Thus, light spreading in the bank layer 140 can be reduced. This causes an increase in the amount of light reaching the first electrode 151 of the side mirror structure, of the light emitted from the light emitting layer 152. Accordingly, the concave portion 141 is formed in the bank layer 140 and the concave portion 141 of the bank layer 140 is disposed on the side portion of the protrusion portion 132 of the overcoating layer 130, whereby the amount of light reaching the first electrode 151 of the side mirror structure, of the light emitted from the light emitting layer 152, can increase to thereby result in an increase in the light extraction efficiency of the light emitting display apparatus 100. At the same time, light reflected by the first electrode 151 increases, whereby front light extraction efficiency, which is extraction efficiency of light extracted in the front direction, can increase.

In addition, in the light emitting display apparatus 100 according to an exemplary embodiment of the present disclosure, the slope of the tangent at a position on the concave portion 141 of the bank layer 140 increases as the position is away from the substrate 110, whereby light extraction efficiency and front light extraction efficiency can increase. For example, when the bank layer 140 includes a single concave portion 141, the light emitting layer 152, the second electrode 153, and the first encapsulating layer 171 are disposed along a shape of the bank layer 140, and thus, the light emitting layer 152, the second electrode 153, and the first encapsulating layer 171 can include a concave surface on a side portion thereof. When the first encapsulating layer 171 includes a concave surface, a first light L1 that can be trapped between the bank layer 140 and the second encapsulating layer 172 by total reflection, among the light emitted from the light emitting layer 152, can be extracted in the front direction. For example, the first light L1 that has been incident on an interface between the bank layer 140 and the light emitting layer 152 and an interface between the first encapsulating layer 171 and the second encapsulating layer 172 at an incidence angle greater than a critical angle and totally reflected from a space between the bank layer 140 and the second encapsulating layer 172 can be incident on the second encapsulating layer 172 at an incidence angle smaller than the critical angle near an edge portion of the upper surface of the bank layer 140 where the concave portion 141 of the bank layer 140 ends.

Therefore, the first light L1 passes through the interface between the first encapsulating layer 171 and the second encapsulating layer 172, and is finally extracted in the front direction of the light emitting display apparatus 100. Accordingly, in the light emitting display apparatus 100 according to an exemplary embodiment of the present disclosure, a path of light that can be trapped between the bank layer 140 and the second encapsulating layer 172 is changed, and thus, light can be extracted in the front direction of the light emitting display apparatus 100, thereby increasing light extraction efficiency and the front light extraction efficiency.

Figure 3:
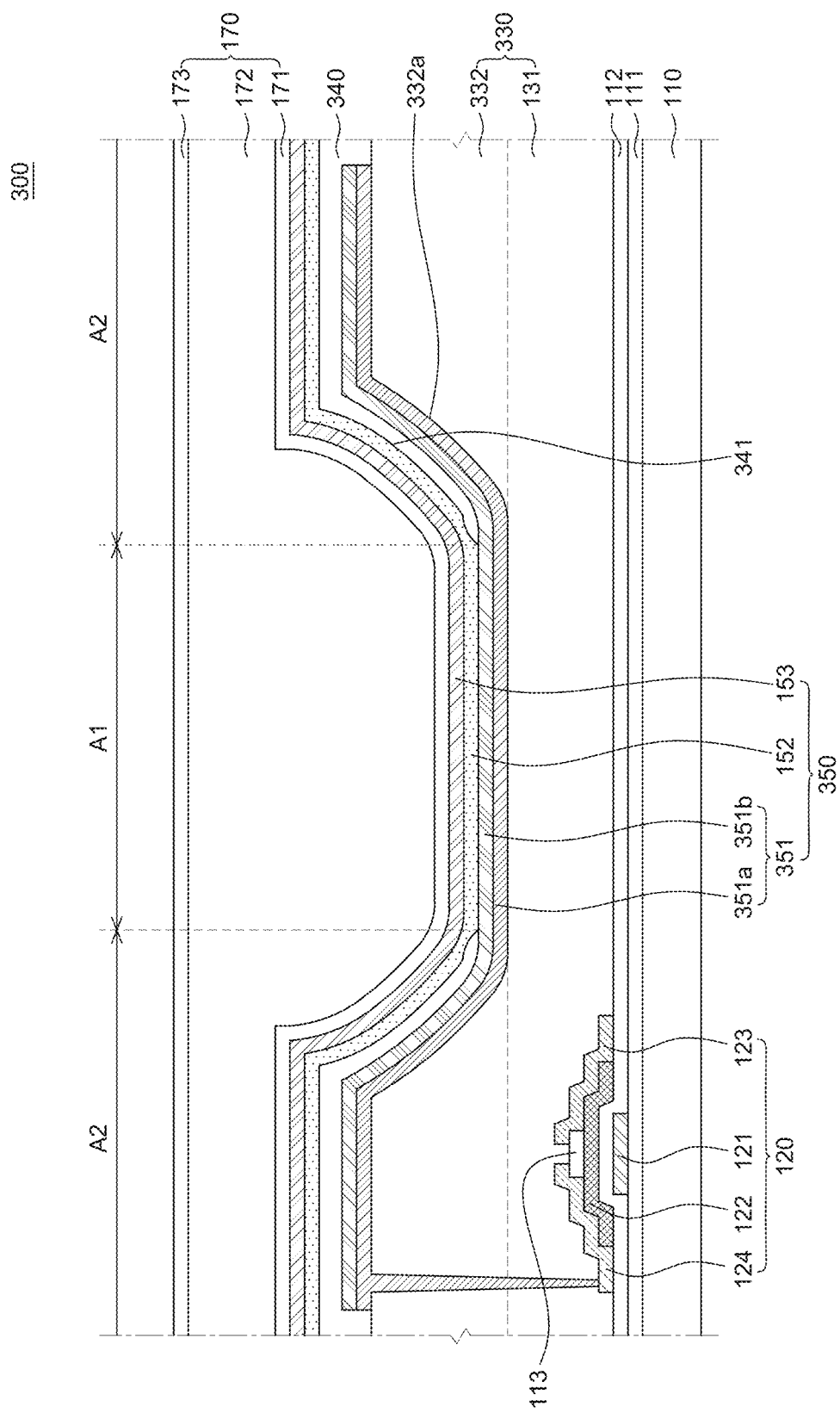
FIG. 3 is a cross sectional view of a light emitting display apparatus according to another exemplary embodiment of the present disclosure.

FIG. 3 is a cross sectional view of a light emitting display apparatus according to another exemplary embodiment of the present disclosure. A light emitting display apparatus 300 of FIG. 3 is different from the light emitting display apparatus 100 of FIGS. 1 and 2, only in terms of an overcoating layer 330, a bank layer 340, and a light emitting element 350, but other configurations thereof are the same or substantially the same as those of the light emitting display apparatus 100 of FIGS. 1 and 2. Thus, a redundant description will be omitted or will be brief.

With reference to FIG. 3, a protrusion portion 332 of the overcoating layer 330 can include a concave portion 332a (e.g., curved portion) at a side portion thereof. For example, the protrusion portion 332 of the overcoating layer 330 includes a single concave portion 332a at the side portion thereof. For example, the concave portion 332a of the protrusion portion 332 can be singularly at a side surface of the protrusion portion 332 connecting an upper surface of the base portion 131 and an upper surface of the protrusion portion 332. The overcoating layer 330 can be referred to as an insulating layer. Thus, the protrusion portion 332 can have an upper surface parallel to the substrate 110 and have a concave side surface. When the concave portion 332a of the protrusion portion 332 is formed singularly, a first electrode 351 on the concave portion 332a of the protrusion portion 332 can also have a concave shape. Accordingly, the light emitted from the light emitting layer 152 is reflected by the first electrode 351 on the concave portion 332a of the protrusion portion 332 without being interfered with by other structures, so that it travels towards the front of the light emitting display apparatus 300. Since the concave portion 332a of the protrusion portion 332 can improve light extraction efficiency and front light extraction efficiency of light emitted from the light emitting layer 152, it can be referred to as a light extraction pattern.

A slope of a tangent (or tangent line) at a position on the concave portion 332a of the protrusion portion 332 can increase as the position is or moves away from the substrate 110. For example, the slope of the tangent of the concave portion 332a of the protrusion portion 332 is lowest at a point of the concave portion nearest to the substrate 110 and increases as the position is or moves away from the substrate 110. The slope of the tangent of the concave portion 332a of the protrusion portion 332 can be largest at a surface of the concave portion farthest from the substrate 110.

The concave portion 332a of the protrusion portion 332 can be formed by a dry etching process. When the protrusion portion 332 is formed by an exposure process, the side portion of the protrusion portion 332 can be formed in a convex shape. Thus, in the light emitting display apparatus 300 according to another exemplary embodiment of the present disclosure, the protrusion portion 332 can be formed to have the concave portion 332a by a dry etching process when the protrusion portion 332 is formed.

The light emitting element 350 is disposed on the overcoating layer 330. The light emitting element 350 includes a first electrode 351 on the overcoating layer 330, the light emitting layer 152 on the first electrode 351, and the second electrode 153 on the light emitting layer 152.

The first electrode 351 includes a reflective layer 351a and a transparent conductive layer 351b on the reflective layer 351a and is disposed on the overcoating layer 330. The first electrode 351 is disposed to cover an upper portion of the base portion 131 and the side portion and an upper portion of the protrusion portion 332. For example, the first electrode 351 can be disposed along a shape of the concave portion 332a of the protrusion portion 332. Accordingly, the first electrode 351 can have a planar upper surface on the upper surface of the protrusion portion 332 and have a concave upper surface on the side surface of the protrusion portion 332. Accordingly, light emitted from the light emitting layer 152 can be reflected by the first electrode 351 and extracted in the front direction of the light emitting display apparatus 300.

With reference to FIG. 3, the bank layer 340 can be formed of an inorganic material. For example, the bank layer 340 can be formed of amorphous silicon, silicon oxide, silicon nitride, or silicon oxynitride, but embodiments are not limited thereto. When the bank layer 340 is formed of an inorganic material, a refractive index of the bank layer 340 can be about 1.8.

The bank layer 340 is disposed on the first electrode 351 of the second area A2. The bank layer 340 can be formed of an inorganic material and can be disposed along a shape of the first electrode 351 in the second area A2. Accordingly, the bank layer 340 can have a planar upper surface on the upper surface of the protrusion portion 332 and can have a concave upper surface on the side surface of the protrusion portion 332. For example, a concave portion 341 of the bank layer 340 is disposed along a shape of the concave portion 332a of the protrusion portion 332 and can be arranged in a position corresponding to the concave portion 332a of the protrusion portion 332. In one example, the concave portion 341 may not extend into the first area A1. The bank layer 340 can be disposed to have a thickness of 200 nm, but embodiments are not limited thereto.

In related art light emitting display apparatuses, a side surface of a protrusion portion can be formed in a convex shape, and a light emitting element on the protrusion portion can also have a convex shape. For example, a first electrode of the light emitting element on the side surface of the protrusion portion can also have a convex shape. However, when the first electrode of a side mirror structure has a convex shape, light emitted from the light emitting layer is reflected on the convex surface of the first electrode and reflected in a direction other than the front direction of the light emitting display apparatus, so that light extraction efficiency in the front direction of the light emitting display apparatus can be degraded.

Accordingly, in the light emitting display apparatus 300 according to another embodiment of the present disclosure, the concave portion 332a is formed on the side portion of the protrusion portion 332, so that a light path of light reflected by the side mirror structure is changed to be in the front direction of the light emitting display apparatus 300, thereby increasing light extraction efficiency and front light extraction efficiency of the light emitting display apparatus 300. For example, when the concave portion 332a is formed on the side portion of the protrusion portion 332, the first electrode 351 and the bank layer 340 on the protrusion portion 332 can also have a concave upper surface on the side portion of the protrusion portion 332. For example, some of the light emitted from the light emitting layer 152 can be reflected by the concave upper surface of the first electrode 351 having the side mirror structure, and can be extracted in the front direction of the light emitting display apparatus 300. For example, some of the light emitted from the light emitting layer 152 can be extracted in the front direction by the principle of a concave mirror.

Accordingly, the concave portion 332a is formed in the side portion of the protrusion portion 332, and the first electrode 351 and the bank layer 340 are disposed along the shape of the concave portion 332a of the protrusion portion 332, whereby light reaching the concave upper surface of the first electrode 351 can be reflected by the principle of the concave mirror to thereby result in increases in light extraction efficiency and front light extraction efficiency of the light emitting display apparatus 300.

Also, in the light emitting display apparatus 300 according to another exemplary embodiment of the present disclosure, the bank layer 340 can be formed of an inorganic material, thereby minimizing light spreading in the bank layer 340. Therefore, by the concave portion 341 of the bank layer 340, a gap between the light emitting layer 152 and the first electrode 351 is minimized and the amount of light reaching the first electrode 351 of the side mirror structure increases, whereby light extraction efficiency of the light emitting display apparatus 300 can increase. For example, when the bank layer 340 is formed of an inorganic material, the bank layer 340 can be disposed along the shape of the first electrode 351 on the protrusion portion 332. Accordingly, the bank layer 340 is disposed along the shape of the concave portion 332a of the protrusion portion 332, and the concave portion 341 of the bank layer 340 is disposed on the concave portion 332a of the protrusion portion 332. Accordingly, a space or area between the side surface of the bank layer 340 and the side surface of the protrusion portion 332 is reduced to thereby lead to a deterioration of light spreading in the bank layer 340, whereby the amount of light reaching the first electrode 351 having the side mirror structure, of the light emitted from the light emitting layer 152, increases.

Therefore, the bank layer 340 is formed of an inorganic material, and the bank layer 340 is disposed along the shape of the concave portion 332a of the protrusion portion 332, whereby the amount of light reaching the first electrode 351 having the side mirror structure, of the light emitted from the light emitting layer 152, can increase to thereby result in an increase in the light extraction efficiency of the light emitting display apparatus 300. Also, light reflected by the first electrode 351 increases, whereby front light extraction efficiency, which is extraction efficiency of light extracted in the front direction, can increase.

Figure 4A:
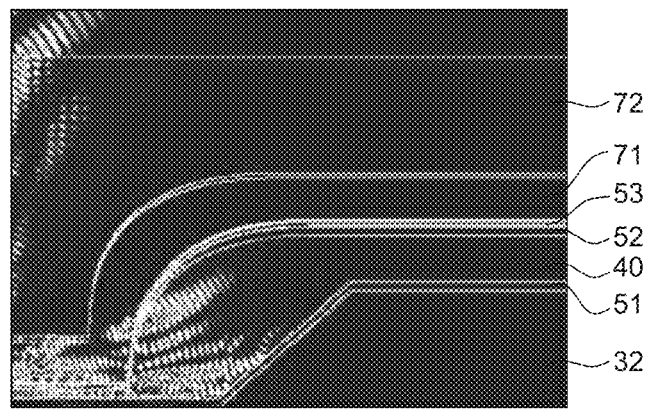
FIGS. 4A and 4B are images for illustrating examples of light extraction efficiency of light emitting display apparatuses according to an exemplary embodiment of the present disclosure and a comparative example.
Figure 4B:
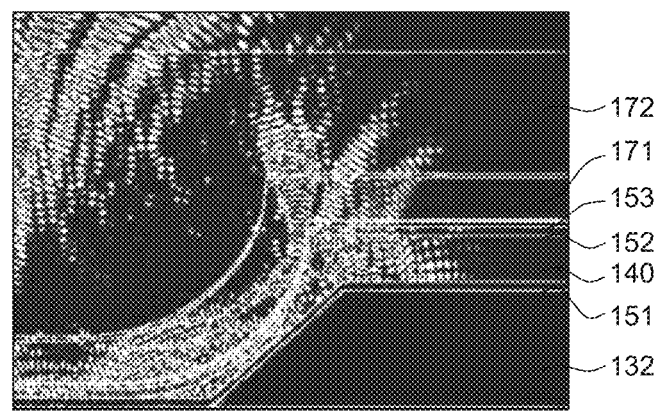

FIGS. 4A and 4B are images for illustrating examples of light extraction efficiency of light emitting display apparatuses according to an exemplary embodiment of the present disclosure and a comparative example. Particularly, FIG. 4A is an image illustrating light extraction efficiency of a light emitting display apparatus according to a comparative example through simulation, with the use of a finite difference time domain (FDTD). FIG. 4B is an image illustrating light extraction efficiency of the light emitting display apparatus according to an exemplary embodiment of the present, disclosure through simulation, with the use of the finite difference time domain (FDTD).

Light emitting display apparatuses 10 and 100 of FIGS. 4A and 4B were formed of the same material and formed to have the same thickness. For example, in the light emitting display apparatuses 10 and 100 of FIGS. 4A and 4B, refractive indices of protrusion portions 32 and 132 of overcoating layers were set to 1.6, refractive indices of bank layers 40 and 140 were set to 1.6, refractive indices of light emitting layers 52 and 152 were set to 1.95, refractive indices of first encapsulating layers 71 and 171 were set to 1.85, and refractive indices of second encapsulating layers 72 and 172 were set to 1.52. In addition, in FIGS. 4A and 4B, it was assumed that the air is disposed above the second encapsulating layers 72 and 172 and a refractive index of the air was set to 1. Here, the bank layers 40 and 140 were set to be polyimide (PI), which is an organic material, and thicknesses of the bank layers 40 and 140 were assumed to be 1 μm. Light extracted from the light emitting display apparatuses 10 and 100 of FIGS. 4A and 4B was illustrated in white.

First, with reference to FIG. 4A, in the light emitting display apparatus 10 according to the comparative example, the bank layer 40 was formed to have a convex shape on a side portion of the protrusion portion 32, so that a space between a side surface of the protrusion portion 32 and a side surface of the bank layer 40 could be widely formed. Thus, when light emitted from the light emitting layer 52 travels to the bank layer 40, light spreading occurs in the bank layer 40, whereby it could be confirmed that the amount of light traveling without reaching the first electrode 51 having a side mirror structure is large.

With reference to FIG. 4B, in the light emitting display apparatus 100 according to an exemplary embodiment of the present disclosure, the bank layer 140 was formed to have a concave shape on the side portion of the protrusion portion 132, so that it could be confirmed that a space between the side surface of the bank layer 140 and the side surface of the protrusion portion 132 is formed to be narrower than that of the light emitting display apparatus 10 of FIG. 4A. Therefore, as the bank layer 140 was formed in a concave shape and a gap between the light emitting layer 152 and the first electrode 151 was minimized, it could be confirmed that light spreading in the bank layer 140 is reduced. Accordingly, it could be confirmed that the amount of light reaching the first electrode 151 of the side mirror structure, of the light emitted from the light emitting layer 152 is increased, whereby the amount of light extracted in the front direction of the light emitting display apparatus 100 is increased.

Table 1 below is a table for comparing light extraction amounts of the light emitting display apparatus 10 according to the comparative example of FIG. 4A and the light emitting display apparatus 100 according to the exemplary embodiment of the present disclosure of FIG. 4B. The below Table 1 shows examples of results calculated based on that external quantum efficiency (EQE) and front light extraction efficiency of the light emitting display apparatus without a side mirror structure are 1, with the use of a finite difference time domain (FDTD) simulation. Also, the front light extraction efficiency is an efficiency of light extracted at angle of ±10° with respect to a direction perpendicular to the light emitting display apparatuses 10 and 100.

With reference to the below Table 1, in the light emitting display apparatus 100 according to the exemplary embodiment of the present disclosure, it could be confirmed that the external quantum efficiency increases by about 6.39% and the front light extraction efficiency increases by about 5.50%, as compared to the light emitting display apparatus 10 according to the comparative example.

TABLE 1

|  | Light Emitting Display Apparatus 10 | Light Emitting Display Apparatus 100 | Rate of Increase |
|---|---|---|---|
| External Quantum Efficiency | 1.080 | 1.149 | 6.39% |
| Front Light Extraction Efficiency | 1.090 | 1.15 | 5.50% |

Figure 5A:
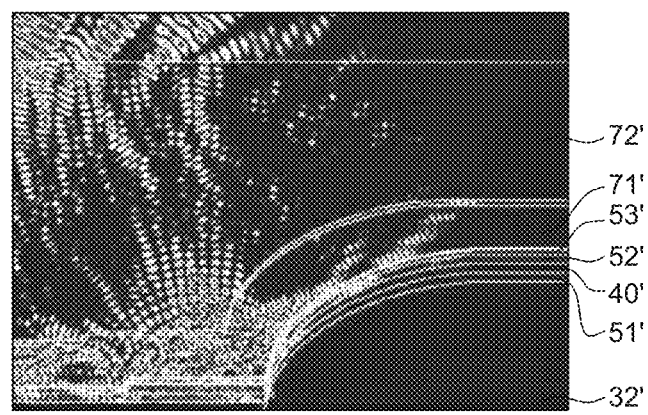
FIGS. 5A and 5B show images for illustrating examples of light extraction efficiency of light emitting display apparatuses according to another exemplary embodiment of the present disclosure and another comparative example.
Figure 5B:
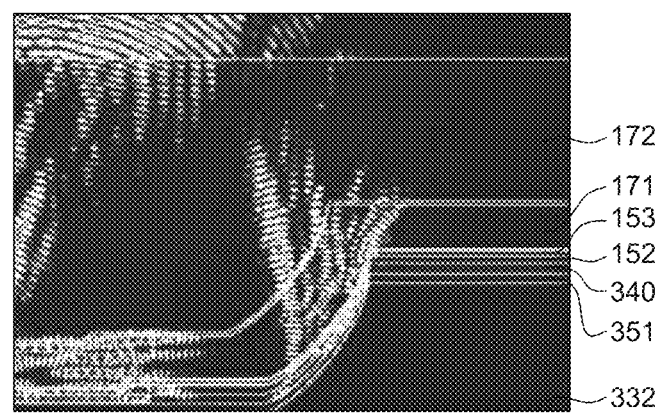

FIGS. 5A and 5B illustrate images for illustrating examples of light extraction efficiency of light emitting display apparatuses according to another comparative example and another exemplary embodiment of the present disclosure. Particularly, FIG. 5A is an image illustrating light extraction efficiency of a light emitting display apparatus according to another comparative example through simulation, with the use of a finite difference time domain (FDTD). FIG. 5B is an image illustrating light extraction efficiency of the light emitting display apparatus according to another exemplary embodiment of the present disclosure through simulation, with the use of the finite difference time domain (FDTD).

Light emitting display apparatuses 10' and 300 of FIGS. 5A and 5B are formed of the same material and formed to have the same thickness. For example, in the light emitting display apparatuses 10' and 300 of FIGS. 5A and 5B, refractive indices of protrusion portions 32' and 332 of overcoating layers were set to 1.6, refractive indices of bank layers 40' and 340 were set to 1.6, refractive indices of light emitting layers 52' and 152 were set to 1.95, refractive indices of first encapsulating layers 71' and 171 were set to 1.85, and refractive indices of second encapsulating layers 72' and 172 were set to 1.52. In addition, it was assumed that the air is disposed above the second encapsulating layers 72' and 172, and a refractive index of the air was set to 1. Here, the bank layers 40' and 340 were set to be silicon nitride (SiNx), which is an inorganic material, and thicknesses of the bank layers 40' and 340 were assumed to be 200 nm. Light extracted from the light emitting display apparatuses 10' and 300 of FIGS. 5A and 5B was in white.

First, with reference to FIG. 5A, in the light emitting display apparatus 10' according to the comparative example, a side surface of the protrusion portion 32' was formed to have a convex shape, and thus, a first electrode 51' was disposed to have a convex shape on a side portion of the protrusion portion 32'. Thus, light emitted from the light emitting layer 52' is reflected on the convex surface of the first electrode 51', whereby it could be confirmed that the amount of light traveling in a direction other than a front direction of the light emitting display apparatus 10' is large.

With reference to FIG. 5B, in the light emitting display apparatus 300 according to another exemplary embodiment of the present disclosure, the side surface of the protrusion portion 332 was formed to have a concave shape and thus, the first electrode 351 was also disposed to have a concave shape on the side surface of the protrusion portion 332. Thus, it could be confirmed that light emitted from the light emitting layer 152 is reflected on a concave upper surface of the first electrode 351 having a side mirror structure by the principle of a concave mirror, whereby the amount of light extracted in the front direction of the light emitting display apparatus 300 increases.

Table 2 below is a table for comparing light extraction amounts of each of the light emitting display apparatus 10' according to the comparative example of FIG. 5A and the light emitting display apparatus 300 according to another embodiment of the present disclosure of FIG. 5B. The below Table 2 shows examples of results calculated based on that external quantum efficiency (EQE) and front light extraction efficiency of the light emitting display apparatus without the side mirror structure are 1, with the use of a finite difference time domain (FDTD) simulation. Also, the front light extraction efficiency is an efficiency of light extracted at angle of ±10° with respect to a direction perpendicular to the light emitting display apparatuses 10' and 300.

With reference to the below Table 2, in the light emitting display apparatus 300 according to another exemplary embodiment of the present disclosure, it could be confirmed that the external quantum efficiency increases by about 8.33% and the front light extraction efficiency increases by about 13.04%, as compared to the case of the light emitting display apparatus 10' according to the comparative example.

TABLE 2

|  | Light Emitting Display Apparatus 10' | Light Emitting Display Apparatus 300 | Rate of Increase |
| --- | --- | --- | --- |
| External Quantum Efficiency | 1.128 | 1.222 | 8.33% |
| Front Light Extraction Efficiency | 1.104 | 1.248 | 13.04% |

Figure 6A:
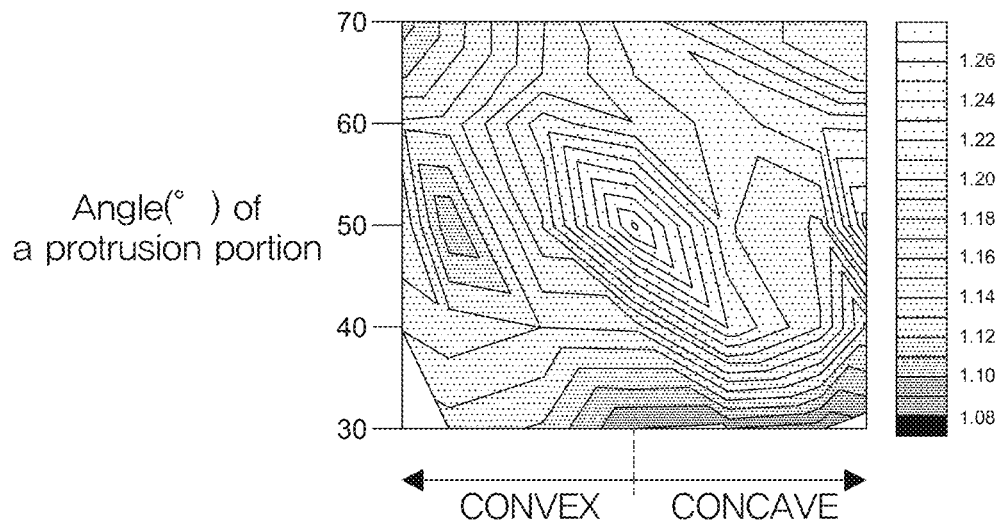
FIGS. 6A and 6B are images showing examples of light extraction efficiency depending on a shape of a protrusion portion and an angle of a side portion of the protrusion portion in the light emitting display apparatus according to another exemplary embodiment of the present disclosure.
Figure 6B:
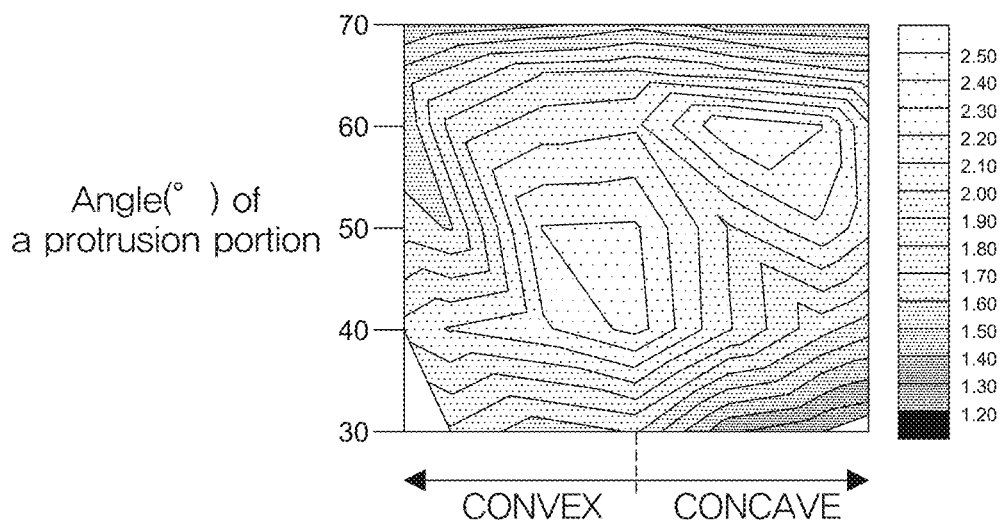

FIGS. 6A and 6B are images showing examples of light extraction efficiency depending on a shape of a protrusion portion and an angle of a side portion of the protrusion portion in the light emitting display apparatus according to another exemplary embodiment of the present disclosure. FIG. 6A is an image showing light extraction efficiency depending on a shape of the protrusion portion 332 and an angle of the side portion of the protrusion portion 332 in the light emitting display apparatus 300 according to another exemplary embodiment when light emitting dipoles inside the light emitting layer 152 were in a horizontal orientation. FIG. 6B is an image showing light extraction efficiency depending on a shape of the protrusion portion 332 and an angle of the side portion of the protrusion portion 332 in the light emitting display apparatus 300 according to another exemplary embodiment when light emitting dipoles inside the light emitting layer 152 were in a vertical orientation.

In the examples of FIGS. 6A and 6B, an X-axis preferably means the shape of the side portion of the protrusion portion 332, and a Y-axis preferably means the angle of the side portion of the protrusion portion 332. For example, with respect to the center of the X-axis, the left side of the X-axis means that the protrusion portion 332 has a convex shape and the right side of the X-axis means that the protrusion portion 332 has a concave shape. In the X-axis, it preferably means that the degree of concavity or the degree of convexity increases in a direction away from the center. In addition, the Y-axis preferably means an average angle between a start point and an end point of the side portion of the protrusion portion 332. Here, the starting point is a point at which a slope of the side portion of the protrusion portion 332 occurs, and the end point is a point at which the slope of the side portion of the protrusion portion 332 becomes gentle. In FIGS. 6A and 6B, bar graphs preferably mean light extraction efficiency, and the lower dot density, the better the light extraction efficiency. In addition, in FIGS. 6A and 6B, the angle of the side portion of the protrusion portion 332 was measured at intervals of about 30° to 70°.

With reference to FIGS. 6A and 6B, in the light emitting display apparatus 300 according to another exemplary embodiment of the present disclosure, it could be confirmed that the light extraction efficiency according to the angle of the side portion of the protrusion portion 332 was improved overall when the shape of the side portion of the protrusion portion 332 was concave rather than convex, in both of a case where light emitting dipoles inside the light emitting layer 152 were in a horizontal orientation and a case where light emitting dipoles inside the light emitting layer 152 were in a vertical orientation.

In addition, with reference to FIG. 6A, it could be confirmed that the light extraction efficiency is improved as a convex shape of the side portion of the protrusion portion 332 is gradually gentle. In addition, it could be confirmed that when the side portion of the protrusion portion 332 has a concave shape, the light extraction efficiency is improved as the degree of concavity decreases.

Also, with reference to FIG. 6B, it could be confirmed that the light extraction efficiency is improved as a convex shape of the side portion of the protrusion portion 332 is gradually gentle. In the light emitting display apparatus 300 of FIG. 6B, it could be confirmed that when the side portion of the protrusion portion 332 has a concave shape, the light extraction efficiency is improved as the degree of concavity increases.

A light emitting display apparatus according to one or more embodiments of the present disclosure will be described below.

According to an embodiment of the present disclosure, a light emitting display apparatus include an insulating layer (e.g., overcoating layer) on a substrate and having a base portion and a protrusion portion, a first electrode covering an upper portion of the base portion and a side portion and an upper portion of the protrusion portion, a bank layer covering a portion of the insulating layer and a portion of the first electrode and having a concave portion, a light emitting layer on the first electrode and the bank layer, and a second electrode on the light emitting layer.

In the light emitting display apparatus according to the present disclosure, the bank layer can include an organic material, the side portion of the protrusion portion can have a planar shape, the first electrode can be disposed along a shape of the side portion of the protrusion portion, and the light emitting layer and the second electrode can be disposed along a shape of the concave portion of the bank layer.

In the light emitting display apparatus according to the present disclosure, the concave portion of the bank layer can be disposed to correspond to the protrusion portion of the insulating layer. For example, the concave portion of the bank layer can be disposed to correspond to the side portion of the protrusion portion of the insulating layer.

In the light emitting display apparatus according to the present disclosure, the concave portion of the bank layer can be formed singularly.

In the light emitting display apparatus according to the present disclosure, the side portion of the protrusion portion of the insulating layer can include a concave portion, and the first electrode can be disposed along a shape of the concave portion of the protrusion portion.

In the light emitting display apparatus according to the present disclosure, the bank layer can include an inorganic material, and the concave portion of the bank layer can be disposed along the shape of the concave portion of the protrusion portion.

In the light emitting display apparatus according to the present disclosure, the first electrode can include a reflective layer.

In the light emitting display apparatus according to the present disclosure, the light emitting display apparatus can further include a first encapsulating layer on the second electrode along a shape of the second electrode; and a second encapsulating layer on the first encapsulating layer.

In the light emitting display apparatus according to the present disclosure, a refractive index of the first encapsulating layer can be greater than a refractive index of the second encapsulating layer.

In the light emitting display apparatus according to the present disclosure, a slope of a tangent (or tangent line) at a position on the concave portion of the bank layer can increase as the position is away from the substrate.

In the light emitting display apparatus according to the present disclosure, a side portion of the bank layer can include a surface connected to an upper portion of the concave portion of the bank layer and perpendicular to the substrate.

According to an aspect of the present disclosure, a light emitting display apparatus includes an overcoating layer on a substrate and having a base portion and a protrusion portion, a light emitting element on the overcoating layer and including a first electrode, a light emitting layer, and a second electrode, a bank layer between the first electrode and the light emitting layer and configured to define a light emitting area, and an encapsulating part on the light emitting element, and an encapsulating part on the light emitting element, wherein a side surface of the bank layer includes a light extraction pattern configured to improve a light extraction efficiency and a front light extraction efficiency by minimizing spreading of light emitted from the light emitting layer.

In the light emitting display apparatus according to the present disclosure, the light extraction pattern of the bank layer can include a concave groove shape.

In the light emitting display apparatus according to the present disclosure, the light extraction pattern of the bank layer can be disposed to surround the light emitting area.

In the light emitting display apparatus according to the present disclosure, the overcoating layer can include a light extraction pattern on a side surface of the protrusion portion.

In the light emitting display apparatus according to the present disclosure, a slope of a tangent at a position on the light extraction pattern of the overcoating layer can increase as the position is away from the substrate.

In the light emitting display apparatus according to the present disclosure, the bank layer can include an inorganic material, and the light extraction pattern of the bank layer can be disposed to correspond to the light extraction pattern of the overcoating layer.

In the light emitting display apparatus according to the present disclosure, the encapsulating part can include a first encapsulating layer, an organic encapsulating layer, and a second encapsulating layer, the first encapsulating layer can be disposed on the second electrode along a shape of the second electrode, the organic encapsulating layer can be disposed on the first encapsulating layer, a refractive index of the organic encapsulating layer can be less than a refractive index of the first encapsulating layer, and a refractive index of the bank layer can be less than or equal to a refractive index of the light emitting layer.

According to an aspect of the present disclosure, a light emitting display apparatus includes an insulating layer (e.g., overcoating layer) on a substrate and having a base portion and a protrusion portion, wherein a side portion of the protrusion portion includes a concave portion, a first electrode on the insulating layer, a bank layer covering a portion of the insulating layer and a portion of the first electrode, and having a concave portion, a light emitting element on the first electrode and the bank layer, and a second electrode on the light emitting layer, the concave portion of the bank layer is disposed along a shape of the concave portion of the protrusion portion of the insulating layer.

In the light emitting display apparatus according to the present disclosure, the first electrode can be disposed along the shape of the concave portion of the protrusion portion of the insulating layer.

It will be apparent to those skilled in the art that various modifications and variations can be made in the present disclosure without departing from the technical idea or scope of the disclosure. Thus, it can be intended that embodiments of the present disclosure cover the modifications and variations of the disclosure provided they come within the scope of the appended claims and their equivalents.

What is claimed is:

1. A light emitting display apparatus, comprising:
    an insulating layer on a substrate and including a base portion having a planar upper surface and a protrusion portion having a planar upper surface and a concave side surface concaved toward a light extraction direction;
    a first electrode covering the planar upper surface of the base portion, the concave side surface of the protrusion portion and the planar upper surface of the protrusion portion;
    a bank layer covering a portion of the insulating layer and a portion of the first electrode, and having a concave portion concaved toward the light extraction direction;
    a light emitting layer on the first electrode and the bank layer; and
    a second electrode on the light emitting layer,
    wherein the concave side surface of the protrusion portion connects the planar upper surface of the base portion and the planar upper surface of the protrusion portion,
    wherein the bank layer includes a side surface facing the concave side surface of the protrusion portion, and
    wherein the side surface of the bank layer includes the concave portion.

2. The light emitting display apparatus of claim 1, wherein the concave portion of the bank layer is disposed to correspond to the protrusion portion of the insulating layer.

3. The light emitting display apparatus of claim 2, wherein the concave portion of the bank layer is formed singularly.

4. The light emitting display apparatus of claim 1, wherein the first electrode is disposed along a shape of the concave side surface of the protrusion portion.

5. The light emitting display apparatus of claim 4, wherein:
    the bank layer includes an inorganic material; and
    the concave portion of the bank layer is disposed along the shape of the concave side surface of the protrusion portion.

6. The light emitting display apparatus of claim 1, wherein the first electrode includes a reflective layer.

7. The light emitting display apparatus of claim 1, further comprising:
    a first encapsulating layer on the second electrode along a shape of the second electrode; and
    a second encapsulating layer on the first encapsulating layer.

8. The light emitting display apparatus of claim 7, wherein a refractive index of the first encapsulating layer is greater than a refractive index of the second encapsulating layer.

9. The light emitting display apparatus of claim 1, wherein a slope of a tangent at a position on the concave portion of the bank layer increases as the position is away from the substrate.

10. The light emitting display apparatus of claim 9, wherein the side surface of the bank layer further includes a surface connected to an upper portion of the concave portion of the bank layer and perpendicular to the substrate.

11. A light emitting display apparatus, comprising:

an overcoating layer on a substrate and including a base portion having a planar upper surface and a protrusion portion having a planar upper surface and a concave side surface;

a light emitting element on the overcoating layer and including a first electrode, a light emitting layer, and a second electrode;

a bank layer between the first electrode and the light emitting layer and configured to define a light emitting area; and an encapsulating part on the light emitting element, wherein the first electrode covers the planar upper surface of the base portion, the concave side surface of the protrusion portion and the planar upper surface of the protrusion portion, wherein the concave side surface of the protrusion portion connects the planar upper surface of the base portion and the planar upper surface of the protrusion portion, wherein the bank layer includes a side surface facing the concave side surface of the protrusion portion, and wherein the side surface of the bank layer includes a light extraction pattern configured to improve a light extraction efficiency and a front light extraction efficiency by minimizing spreading of light emitted from the light emitting layer.

12. The light emitting display apparatus of claim 11, wherein the light extraction pattern of the bank layer includes a concave groove shape.

13. The light emitting display apparatus of claim 12, wherein the light extraction pattern of the bank layer is disposed to surround the light emitting area.

14. The light emitting display apparatus of claim 11, wherein a slope of a tangent at a position on the concave side surface of the protrusion portion increases as the position is away from the substrate.

15. The light emitting display apparatus of claim 14, wherein:

the bank layer includes an inorganic material; and the light extraction pattern of the bank layer is disposed to correspond to the concave side surface of the protrusion portion.

16. The light emitting display apparatus of claim 11, wherein:

the encapsulating part includes a first encapsulating layer, an organic encapsulating layer, and a second encapsulating layer;

the first encapsulating layer is disposed on the second electrode along a shape of the second electrode;

the organic encapsulating layer is disposed on the first encapsulating layer;

a refractive index of the organic encapsulating layer is less than a refractive index of the first encapsulating layer; and a refractive index of the bank layer is less than or equal to a refractive index of the light emitting layer.

17. A light emitting display apparatus, comprising:

an insulating layer on a substrate and including a base portion having a planar upper surface and a protrusion portion having a planar upper surface and a concave side surface concaved toward a light extraction direction;

a first electrode on the insulating layer;

a bank layer covering a portion of the insulating layer and a portion of the first electrode, and having a concave portion concaved toward the light extraction direction;

a light emitting layer on the first electrode and the bank layer; and a second electrode on the light emitting layer, wherein the concave side surface of the protrusion portion connects the planar upper surface of the base portion and the planar upper surface of the protrusion portion, wherein the bank layer includes a side surface facing the concave side surface of the protrusion portion, wherein the side surface of the bank layer includes the concave portion, and wherein the concave portion of the bank layer is disposed along a shape of the concave side surface of the protrusion portion of the insulating layer.

18. The light emitting display apparatus of claim 17, wherein the first electrode is disposed along the shape of the concave side surface of the protrusion portion of the insulating layer.

* * * * *